United States Patent
Lee

(10) Patent No.: US 7,618,862 B2
(45) Date of Patent: Nov. 17, 2009

(54) FLASH MEMORY DEVICE AND METHOD FOR MANUFACTURING THE SAME

(75) Inventor: Joo-Hyeon Lee, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 258 days.

(21) Appl. No.: 11/847,668

(22) Filed: Aug. 30, 2007

(65) Prior Publication Data

US 2008/0067579 A1    Mar. 20, 2008

(30) Foreign Application Priority Data

Sep. 18, 2006    (KR) .................. 10-2006-0090066

(51) Int. Cl.
H01L 21/336    (2006.01)
H01L 21/3205   (2006.01)
H01L 21/28     (2006.01)

(52) U.S. Cl. .............. 438/257; 438/261; 438/595; 438/264; 438/267; 257/E21.179

(58) Field of Classification Search ............... 438/257, 438/261, 264, 267, 595; 257/E21.179
See application file for complete search history.

(56) References Cited

U.S. PATENT DOCUMENTS 5,397,725 A * 3/1995 Wolstenholme et al. ..... 438/261
5,856,223 A * 1/1999 Wang ......................... 438/264
6,200,858 B1 * 3/2001 Kokubu ...................... 438/261
7,129,539 B2 * 10/2006 Iwata et al. ................. 257/324
7,199,007 B2 * 4/2007 Tseng et al. ................ 438/257

FOREIGN PATENT DOCUMENTS

KR    10-2005-59900    6/2005
KR    10-2005-73229    7/2005

* cited by examiner

Primary Examiner—Luan C Thai
(74) Attorney, Agent, or Firm—Sherr & Vaughn, PLLC

(57) ABSTRACT

A method for manufacturing a flash memory device includes: a) forming a stack gate pattern composed of a tunnel oxide layer, a floating gate, ONO layers, and a control gate on a semiconductor substrate; b) conformably forming a first sidewall oxide layer made of a silicon oxide layer along both sidewalls of the stack gate pattern; c) performing a plasma nitride process for forming a nitride barrier layer in the first sidewall oxide layer; d) forming a sidewall nitride layer on the first sidewall oxide layer; e) conformably forming a second sidewall oxide layer on the sidewall nitride layer; and f) performing an etching process for forming a spacer which includes the first sidewall oxide layer, the nitride barrier layer, the sidewall nitride layer, and the second sidewall oxide layer. The flash memory device prevents data from being lost via the spacer equipped with a nitride barrier layer, resulting in increased reliability of a desired flash memory device.

20 Claims, 3 Drawing Sheets

FLASH MEMORY DEVICE AND METHOD FOR MANUFACTURING THE SAME

The present application claims the benefit of Korean Patent Application No. 10-2006-0090066, filed Sep. 18, 2006, which is hereby incorporated by reference in its entirety.

BACKGROUND

Figure 1:
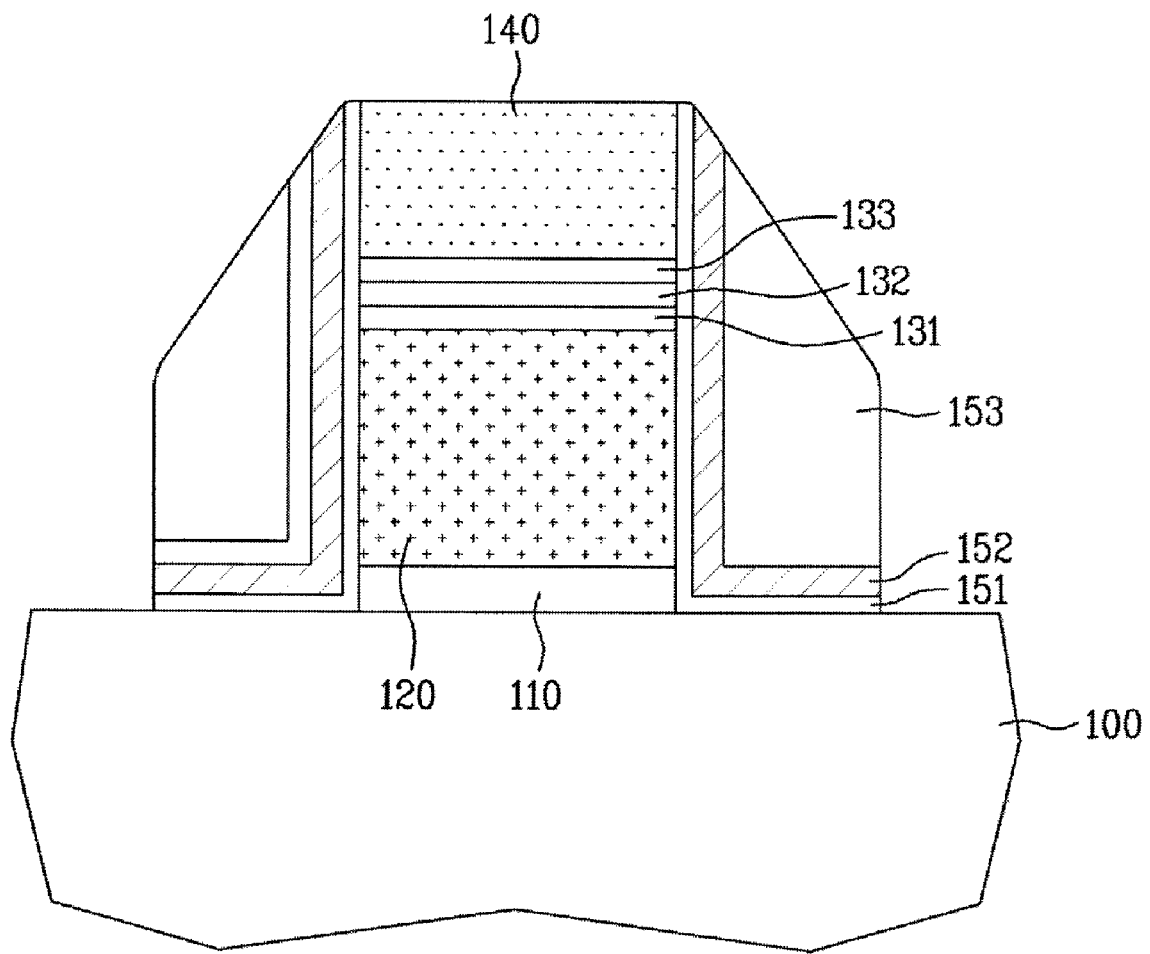

Example FIG. 1 is a cross-sectional view illustrating the implantation of N-type dopants according to a method for manufacturing a flash memory device. As shown in example FIG. 1, a flash memory device includes a stack gate pattern, which includes a tunnel oxide layer 110, a floating gate 120, ONO layers 131, 132, and 133 and a control gate 140 on the silicon substrate 100. In order to form a spacer on the stack gate pattern, a lower spacer oxide layer 151, a spacer nitride layer 152, and an upper spacer oxide layer 153 are sequentially deposited using a CVD (Chemical Vapor Deposition) method. Thereafter, if a dry etching process is executed to form the spacer, a spacer structure may be formed at both sides of the stack gate pattern as shown in example FIG. 1.

However, the higher the memory capacity, the higher the integration degree of the flash memory device should be, such that the spacer thickness is unavoidably limited. As the integration degree of the flash memory device increases (i.e., feature size decreases), the flash memory device becomes weaker in the important characteristics (e.g., data retention fail (DRF) and high temperature operating life (HTOL)) associated with performances of the flash memory device. Particularly, the smaller the device size, the thinner the spacer which contributes to the loss of data. Indeed, the aforementioned data-loss problem is considered to be a serious problem in flash memory devices where the line width is 13 nm or less. To make matters worse, if the contact hole further limits the thickness of the spacer, the aforementioned data-loss problem caused by the spacer becomes more serious.

Therefore, as the spacer becomes thinner by shrinking a flash memory device, the stored data may be more easily lost, thereby reducing the reliability of the flash memory device.

SUMMARY

Embodiments relate to a method for manufacturing a flash memory device. In accordance with this method a stack gate pattern is formed on a semiconductor substrate and a first sidewall oxide layer is formed along both sidewalls of the stack gate pattern. Then a nitride barrier is formed layer in the first sidewall oxide layer, a sidewall nitride layer is formed on the first sidewall oxide layer, and a second sidewall oxide layer is formed on the sidewall nitride layer. Next, a spacer is formed which includes the first sidewall oxide layer, the nitride barrier layer, the sidewall nitride layer, and the second sidewall oxide layer.

Embodiments relate to a flash memory device that includes a stack gate pattern, having a tunnel oxide layer, a floating gate, ONO layers, and a control gate, formed on a semiconductor substrate; a spacer, which sequentially includes a first sidewall oxide layer, a sidewall nitride layer, and a second sidewall oxide layer, formed along both sidewalls of the stack gate pattern; and a nitride barrier layer formed in the first sidewall oxide layer.

DRAWINGS

Example FIG. 1 is a cross-sectional view illustrating the implantation of N-type dopants according to a method for manufacturing a flash memory device.

Figure 2:
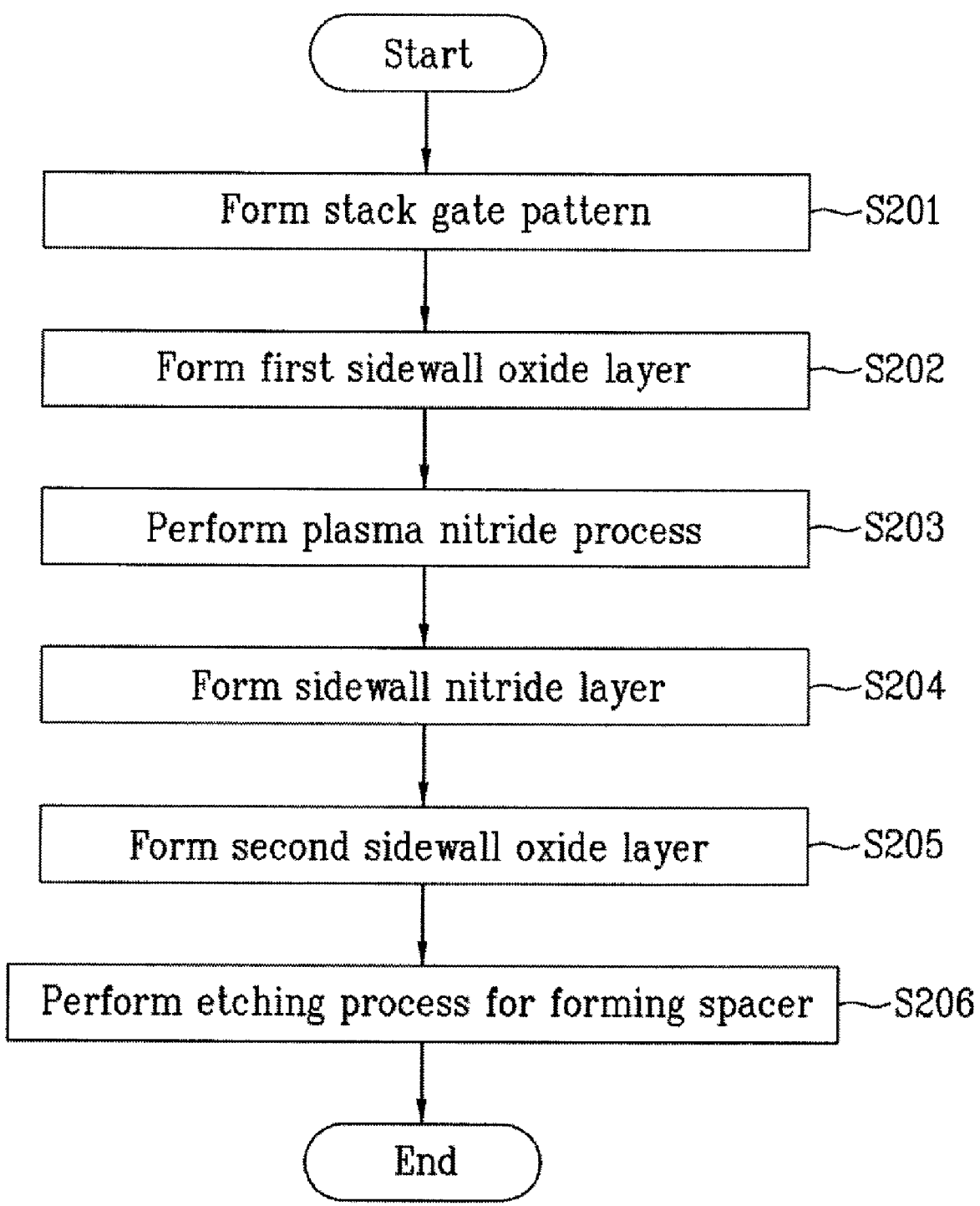

Example FIG. 2 is a flow chart illustrating a method for manufacturing a flash memory device according to embodiments.

Figure 3:
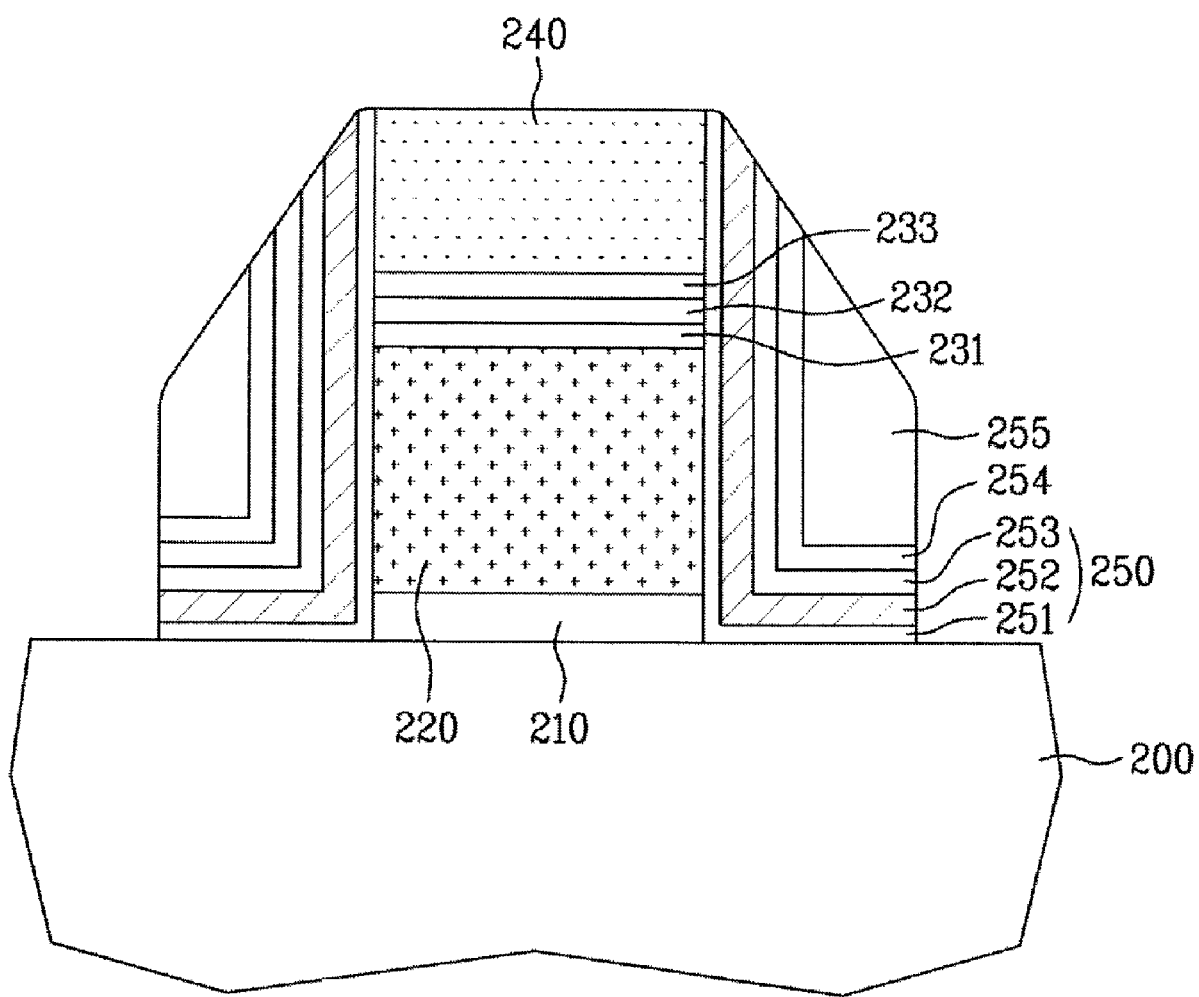

Example FIG. 3 is cross-sectional view illustrating a method for manufacturing a flash memory device according to embodiments.

DESCRIPTION

Reference will now be made in detail to the embodiments, examples of which are illustrated in the accompanying drawings. Wherever possible, the same reference numbers will be used throughout the drawings to refer to the same or like parts.

Example FIG. 2 is a flow chart illustrating a method for manufacturing a flash memory device according to embodiments. Example FIG. 3 is cross-sectional view illustrating a method for manufacturing a flash memory device according to embodiments.

A method for manufacturing a flash memory device according to embodiments forms a stack gate pattern on the semiconductor substrate 200 at step S201. The stack gate pattern includes a tunnel oxide layer 210, a floating gate 220, ONO layers (231, 232, and 233) and a control gate 240.

The first sidewall oxide layer 250 formed of a silicon oxide layer formed, for example, by a CVD method is conformably formed with a thickness of approximately 100 Å to approximately 150 Å at both sidewalls of the stack gate pattern at step S202.

A plasma nitride process for forming a nitride barrier layer 252 in the first sidewall oxide layer 250 is performed at step S203.

In this case, the plasma nitride process is performed using N2 gas of approximately 2 slm and Ar gas of approximately 1 slm at a temperature of approximately 500° C. or less for approximately 1 to approximately 10 minutes under the condition that atmospheric pressure of approximately 300 Pa or less and source power of approximately 700 W to approximately 3300 W have been provided. The N2 gas is injected in the first sidewall oxide layer 250, such that the nitride layer 252 may be formed with a thickness of approximately 20 Å to approximately 40 Å.

Therefore, the nitride barrier layer 252 between the first upper-oxide layer 253 and the first lower-oxide layer 251 is formed, and prevents data stored in a cell from being lost after the spacer has been formed. This prevention of data loss is the same effect as that of having a spacer with an increased thickness. Also, the plasma nitride process may not be damaged by plasma, and is executed at a low temperature, so that it has little affect on the characteristics of the flash memory device.

After the nitride barrier layer 252 is formed, the sidewall nitride layer 254 is formed on the first upper-oxide layer 253 at step S204. The sidewall nitride layer 254 may be formed of SiN, etc.

After the sidewall nitride layer 254 is formed, the second sidewall oxide layer 255 is conformably formed on the sidewall nitride oxide layer 254 at step S205.

Once the first lower-oxide layer 251, the nitride barrier layer 252, the first upper-oxide layer 253, the sidewall nitride layer 254, and the second sidewall oxide layer 255 are arranged along both sidewalls of the stack gate pattern, the etching process for forming the spacer is performed at step S206. In this case, isotropic RIE (Reactive Ion Etch) or isotropic plasma etching process for forming the spacer may, for example, be performed. As a result, as shown in example FIG. 3, the nitride barrier layer 252 is contained in the first sidewall oxide layer 250, such that it prevents data from being lost via the spacer. As described above, the nitride barrier layer 252 prevents data from being lost via the spacer such that it prevents the data retention fail (DRF) problem from being generated, and also solves the high temperature operating life (HTOL) problem.

As apparent from the above description, the flash memory device and a method for manufacturing the same prevent data from being lost by virtue of the spacer equipped with a nitride barrier layer. This device, and its method of manufacture, prevents the data retention fail (DRF) problem from occurring, and also solves the high temperature operating life (HTOL) problem; thus, resulting in increased reliability of the flash memory device.

It will be apparent to those skilled in the art that various modifications and variations can be made without departing from the spirit or scope of the embodiments described herein. Thus, the description is intended to cover the modifications and variations provided they come within the scope of the appended claims and their equivalents.

What is claimed is:

1. A method for manufacturing a flash memory device comprising:
    forming a stack gate pattern on a semiconductor substrate;
    forming a first sidewall oxide layer along both sidewalls of the stack gate pattern;
    forming a nitride barrier layer in the first sidewall oxide layer;
    forming a sidewall nitride layer on the first sidewall oxide layer;
    forming a second sidewall oxide layer on the sidewall nitride layer; and
    forming a spacer which includes the first sidewall oxide layer, the nitride barrier layer, the sidewall nitride layer, and the second sidewall oxide layer.

2. The method of claim 1, wherein the stack gate pattern comprises a tunnel oxide layer, a floating gate, ONO layers, and a control gate.

3. The method of claim 1, wherein the first sidewall oxide layer is conformally formed.

4. The method of claim 1, wherein forming the nitride barrier layer further includes performing a plasma nitride process.

5. The method of claim 1, wherein the second sidewall oxide layer is conformally formed.

6. The method of claim 1, wherein forming the spacer further includes performing an etching process.

7. The method of claim 1, wherein the first sidewall oxide layer is formed with a thickness of approximately 100 Å to approximately 150 Å.

8. The method of claim 4, wherein the plasma nitride process is performed using N2 gas of approximately 2 slm and Ar gas of approximately 1 slm.

9. The method of claim 4, wherein the plasma nitride process is performed at a temperature of approximately 500° C. or less.

10. The method of claim 4, wherein, the plasma nitride process is performed for approximately 1 to approximately 10 minutes.

11. The method of claim 4, wherein, the plasma nitride process is performed under an atmospheric pressure not more than approximately 300 Pa.

12. The method of claim 4, wherein, the plasma nitride process is performed with a source power of approximately 700 to approximately 3300 W.

13. The method of claim 1, wherein the nitride barrier layer is formed with a thickness of approximately 20 Å to approximately 40 Å.

14. The method of claim 6, wherein the etching process for forming the spacer is an isotropic RIE (Reactive Ion Etch).

15. The method of claim 6, wherein the etching process for forming the spacer is an isotropic plasma etching process.

16. The method of claim 1, wherein the first sidewall oxide layer is comprised of silicon oxide.

17. A flash memory device comprising:
    a stack gate pattern, which includes a tunnel oxide layer, a floating gate, ONO layers, and a control gate, formed on a semiconductor substrate;
    a spacer, which sequentially includes a first sidewall oxide layer, a sidewall nitride layer, and a second sidewall oxide layer, formed along both sidewalls of the stack gate pattern; and
    a nitride barrier layer formed in the first sidewall oxide layer.

18. The flash memory device of claim 17, wherein the first sidewall oxide layer has a thickness between approximately 100 Å to approximately 150 Å.

19. The flash memory device of claim 17, wherein the nitride barrier layer has a thickness between approximately 20 to approximately 40 Å.

20. The flash memory device of claim 17, wherein the nitride barrier layer is formed using a plasma nitride process.

* * * * *